United States Patent [19]

Cunningham

[11] Patent Number: 4,848,644
[45] Date of Patent: Jul. 18, 1989

[54] DRAG SOLDERING METHOD AND APPARATUS FOR PRINTED WIRING BOARDS

[75] Inventor: Ben J. Cunningham, College Station, Tex.

[73] Assignee: Westinghouse Electric Corp., Pittsburgh, Pa.

[21] Appl. No.: 220,761

[22] Filed: Jul. 13, 1988

[51] Int. Cl.$^4$ ............................ H05K 3/34; B23K 1/08
[52] U.S. Cl. .................................. 228/180.1; 228/259; 228/36; 228/40; 228/43
[58] Field of Search .................. 228/259, 180.1, 180.2, 228/40, 36, 43; 118/423; 427/431, 433, 436

[56] References Cited

U.S. PATENT DOCUMENTS

| | | | |
|---|---|---|---|
| 3,896,921 | 7/1975 | Sund et al. | 198/19 |
| 4,285,457 | 8/1981 | Kondo | 228/40 |
| 4,311,266 | 1/1982 | Kondo | 228/40 |
| 4,512,510 | 4/1985 | Kondo | 228/40 |
| 4,637,541 | 1/1987 | Tanny | 228/180.1 |
| 4,685,605 | 8/1987 | Spigarelli et al. | 228/37 |

Primary Examiner—Kenneth J. Ramsey
Assistant Examiner—Samuel M. Heinrich
Attorney, Agent, or Firm—W. G. Sutcliff

[57] ABSTRACT

The invention is an improved drag soldering machine for printed wiring boards (PWB) for providing a uniform vertical velocity at the point of separation between the solder and the PWBs. The improved drag soldering machine has a molten solder bath, an entry guide for directing the PWB to a horizontal position partially submerged in the solder bath, a drag guide for horizontally directing the PWB across the solder bath, an exit guide for separating the PWB from the solder bath by directing the PWB up and away from the solder bath and a transport means for advancing the PWB in the guide means, wherein the improvement comprises an exit guide providing an approximately uniform vertical velocity at the point of separation between the PWB and the solder bath thereby promoting a uniform soleder distribution over the length of the PWB.

6 Claims, 4 Drawing Sheets

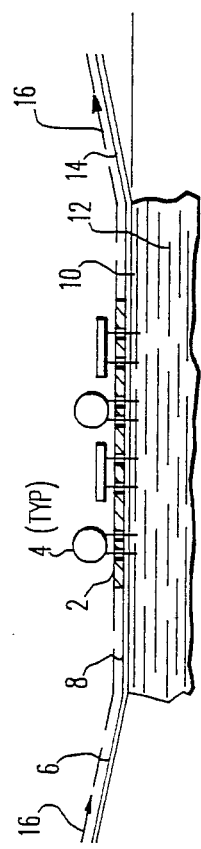
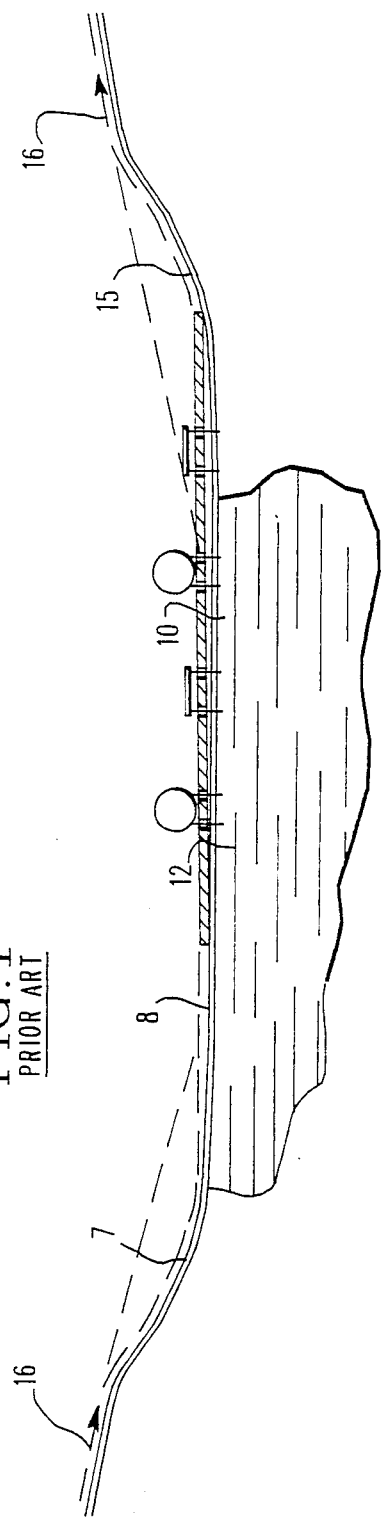

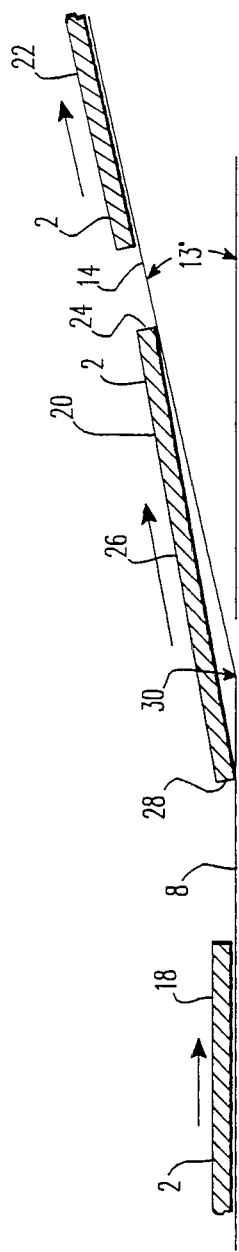
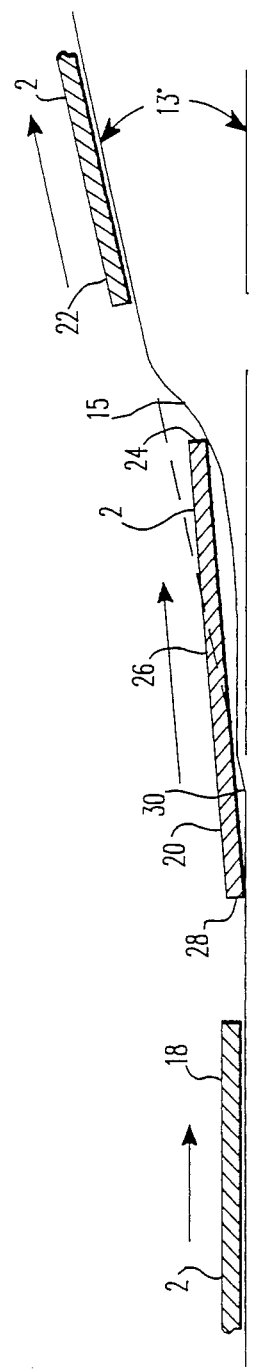
FIG. 2 PRIOR ART
FIG. 5

DRAG SOLDERING METHOD AND APPARATUS FOR PRINTED WIRING BOARDS

BACKGROUND OF THE INVENTION

This invention relates to soldering machines and methods and more particularly to an improved drag soldering machine and method for the soldering of through-hole printed wiring boards (PWB).

Soldering is widely employed for the fabrication of many different products, especially products in the electronics field and notably through-hole printed wiring boards (PWB). Typically, electronic components with extending leads are connected to circuitry on the PWBs by soldering the leads into preexisting holes on the PWB. For the mating of electronic components to the PWBs a variety of different types of soldering techniques may be employed. The most common technique is wave soldering which involves moving a PWB in one direction across the crest of a stationary, continuously replenished wave of molten solder. The solder wave contacts the bottom of the PWB and simultaneously wets the holes in the PWB and the electronic component leads extending through these holes. Upon moving past the solder wave, excess solder drains away and a quality solder joint remains between the leads and the PWB. Another technique, drag soldering, involves lowering a pallet supporting the through-hole PWB with electronic components in place on the board into a solder bath until the PWB contacts with the solder. The PWB is then dragged a predetermined distance along the surface of the bath, after which it is lifted from the bath. Just as with wave soldering the solder simultaneously wets the holes in the PWB and the electronic leads of the components. After the PWB is lifted from the solder bath, excess solder drains and solder joints remain which attach the component leads to the PWB.

Prior to the introduction and promotion of the wave soldering technique, drag soldering was a popular means for soldering PWBs. Wave soldering has became a more popular soldering technique because in most instances the wave soldering technique minimizes defects such as bridging and excess solder on the bottom side of the PWB. However, recent modifications in PWB design and the addition of heat sinks have caused wave soldering techniques to be inadequate for heat transfer for these PWBs.

With technological advances the thickness of the PWB has become an important design factor because as new condensed electrical components become available the need to develop more densely populated PWBs emerges. This dense population of circuitry causes higher operating temperatures of the PWB whicn in turn demands the addition of heat sinks to the PWB design. Furthermore, this increased circuit density requires multilayer PWBs to provide enough circuit paths for the components to properly communicate with other components on the PWB. This results in a thicker PWB having a greater thermal mass, thereby exceeding the capability of the wave soldering technique to uniformly heat the PWB.

Using a wave soldering machine on thick PWBs is inadequate because of nonuniform heating across the length of the board caused by the wave soldering technique. Specifically, while the cold leading edge of the PWB requires a greater heat transfer rate from the solder wave to raise the leading edge to a minimum temperature, this same heat transfer rate causes the trailing edge of the PWB to overheat. The high rate of heat transfer causes the portion of the PWB approaching the solder wave to accumulate heat through heat conduction before it actually contacts the solder wave. Consequently, as the PWB passes over the solder wave the PWB portion which has already been substantially heated from previous heat conduction now passes over the solder wave and receives additional and excessive heating from the solder wave. Overheating the PWB during the solder process is unacceptable and subsequently wave soldering of thick PWBs is not acceptable. This is particularly a problem with thick PWBs and printed wiring assemblies with heat sinks since longer contact periods with the solder wave permit more extensive heat transfer.

On the other hand, the drag soldering technique permits the entire length of the PWB to dwell in the heated solder for a fixed period. This permits a relatively uniform heating of the PWB across its entire length, which is especially advantageous to the soldering of thick PWBs. Furthermore, a drag soldering machine generally is much less complex than a wave soldering machine and consequently maintenance costs are much less. Ideally for the soldering of electronic components to a thick PWB, the uniform heating of the drag soldering technique is desirable but the problem of defects caused by bridging and excess solder must be solved.

An object of this invention is to provide a solution to the current problem of drag solder defects caused by bridging and excess solder on the PWB.

FIG. 1 illustrates a schematic of a drag soldering machine. A PWB 2 with electronic components 4 in place enters the drag solder machine along a linear entry guide 6 and is moved along a drag guide 8 over the surface 10 of a molten solder bath 12. The PWB 2 is then removed from the solder bath 12 along a linear exit guide 14. The PWB 2 is moved in and out of the solder bath 12 using a transport means 16, which may consist of a motor-driven chain (not shown) that pulls a pallet (not shown) into which the PWB 2 would be placed. Note that in actuality the PWB is placed in a pallet and it is the pallet that is guided. For simplicity the PWB will be exactly the length of the pallet such that when the pallet enters and leaves the solder bath, the PWB will do so simultaneously. For this reason the PWB will be discussed without reference to the pallet. In actuality the pallet will probably be longer than the PWB.

In drag soldering a significant factor effecting the quantity of solder remaining on the solder joints and the PWB and a significant factor also effecting bridging, in which solder bridges between two terminals, is the vertical velocity of the PWB as it separates from the solder in the solder bath. This vertical velocity is also known as the peel-out velocity of the PWB with respect to the solder bath since this motion causes the PWB to separate, or peel, from the solder bath. A high vertical velocity leaves a large quantity of solder on the PWB, while a low velocity leaves a lesser quantity of solder on the PWB. A high vertical velocity also creates more bridging. Control of this influential vertical velocity has not been accomplished on existing drag soldering machines.

A more detailed sketch of a typical drag soldering machine exit guide is shown in FIG. 2. Typically, the linear exit guide 14 consists of a linear ramp oriented at an angle of approximately 13 degrees from the horizontal plane created by the solder bath surface 10 (see FIG.

1). This feature is highlighted in FIG. 2, which shows the PWB 2 in three positions. Position 18 shows the PWB on the drag guide 8. Position 20 shows the PWB 2 in transition between the drag guide 8 and the linear exit guide 14. Position 22 shows the PWB 2 on the linear exit guide 14. The vertical velocity of the PWB 2 as it leaves the solder bath depends on the velocity at which the PWB 2 moves across the drag guide 8 onto the linear exit guide 14 and the contour of the linear exit guide 14. Ideally, the vertical velocity at the point of separation of the PWB 2 from the solder of the solder bath should be constant across the length of the PWB 2. Since the actual point of separation of the PWB from the solder bath is strictly a function of the distance between the PWB and the solder bath and typically this distance is about $\frac{1}{8}''$, the critical vertical velocity is that velocity occurring at the portion of the PWB that is $\frac{1}{8}''$ from the solder bath. Note that this separation distance of about $\frac{1}{8}''$ is a function of the solder and the temperature of the solder. For simplicity and as an approximation, the vertical velocity of the PWB at the instant the PWB leaves the solder bath, not when the PWB is a $\frac{1}{8}''$ distance from the solder bath, will be used in this discussion.

Defining a leading edge 24, a middle point 26 and a trailing edge 28 on the PWB 2, it can be shown that the vertical velocity of the PWB from the solder bath for the configuration shown in FIG. 2, which is typical of existing drag soldering machines, is not constant. Once the PWB 2 passes a transition point 30 between the drag guide 8 and the linear exit guide 14, separation between the PWB 2 and the solder bath begins. Given a velocity V of the PWB 2 parallel to the linear exit guide 14, when the leading edge 24 of the PWB 2 passes the point 30 of transition, the vertical velocity increases from zero to V sin $\theta$, where $\theta$ in this instance is equal to 13°, while the vertical velocity of the trailing edge 28 remains at zero. From the time the leading edge 24 passes the transition point 30, until the trailing edge 28 passes the transition point 30, the vertical velocity of any intermediate point, including the midpoint 26, may range in speed between zero and V×sin $\theta$. The result of this is that the vertical velocity at the point of separation of the PWB 2 from the solder bath changes across the length of the PWB. The velocity of those points on the PWB closest to the leading edge 24 is much higher than that of those points closer to the trailing edge 28. Relating this to the drag soldering process, a larger quantity of solder is left deposited on those points of the PWB closer to the leading edge 24 than on those points closer to the trailing edge 26 since as mentioned earlier a high speed of withdrawal leaves a large quantity of solder on the PWB. This larger quantity of solder is the major cause of bridging on the PWB.

FIG. 3 is a graph which illustrates the fraction of the PWB which separates from the solder bath as the PWB is moved from the drag guide to the linear exit guide. FIG. 3 actually shows the location of the point of separation of the solder from the surface of the PWB. As mentioned earlier, this occurs when the PWB is about $\frac{1}{8}''$ above the solder bath. As the PWB begins to travel along the linear exit guide the distance between the board and the solder bath increases until the leading edge of the board is a vertical distance of about $\frac{1}{8}''$ from the solder bath. At this point the leading edge of the PWB breaks away from the solder. As the board continues to travel from the drag guide to the linear exit guide, the portion of the PWB that becomes separated from the solder bath increases rapidly. FIG. 3 illustrates that when the PWB has travelled about 20% of its length, 80% of the PWB has separated from the solder bath. Similarly, the vertical velocity of the point of separation in this region is very high which causes excessive amounts of solder to be deposited across the leading section the PWB. Furthermore, only 20% of the PWB is drained during the remaining 80% of the PWB travel onto the exit guide which necessarily indicates a relatively slow vertical velocity at the point of separation for 80% of the PWB. Ideally the PWB should be withdrawn from the solder bath so that a uniform vertical velocity exists across the length of the PWB at the point of separation between the PWB and the solder bath.

It is an object of this invention to provide a means by which a printed wiring board may be separated from a solder bath such that a uniform vertical velocity exists across the distance of the PWB at the point of separation between the PWB and the solder bath resulting in approximately equal amounts of solder deposited across the length of the PWB.

SUMMARY OF THE INVENTION

The invention is an improved drag soldering machine for printed wiring boards (PWB) for providing a uniform vertical velocity at the point of separation between the solder and the PWBs. The improved drag soldering machine has a molten solder bath, an entry guide for directing the PWB to a horizontal position partially submerged in the solder bath, a drag guide for horizontally directing the PWB across the solder bath, an exit guide for separating the PWB from the solder bath by directing the PWB up and away from the solder bath and a transport means for advancing the PWB in the guide means, wherein the improvement comprises an exit guide providing an approximately uniform vertical velocity at the point of separation between the PWB and the solder bath thereby promoting a uniform solder distribution over the length of the PWB.

BRIEF DESCRIPTION OF THE DRAWINGS

FIG. 1 is prior art and shows a schematic of a typical drag soldering system.

FIG. 2 is prior art and is a sketch showing the movement of a PWB on a typical drag soldering machine from a position submerged in the solder bath to a position in which the PWB has separated from the solder in the solder bath.

FIG. 4 shows a schematic of a drag soldering system with the improvement of this invention.

FIG. 5 shows the movement of the PWB using the improvement of this invention.

DESCRIPTION OF THE PREFERRED EMBODIMENT

The invention is a modification to the exit guide on a drag soldering machine whereby approximately a uniform vertical velocity is provided between the printed wiring board and the solder bath at the point of separation of the PWB from the solder bath. The schematic of the modified drag soldering machine shown in FIG. 4 illustrates the invention. Note this schematic is identical to that shown in FIG. 1, except Item 6 in FIG. 1 the linear entry guide, and Item 14, the linear exit guide, have both been modified. While one embodiment of this invention involves modifying only the exit guide 14, another embodiment involves modifying both the entry guide 6 and the exit guide 14.

Figure 3:
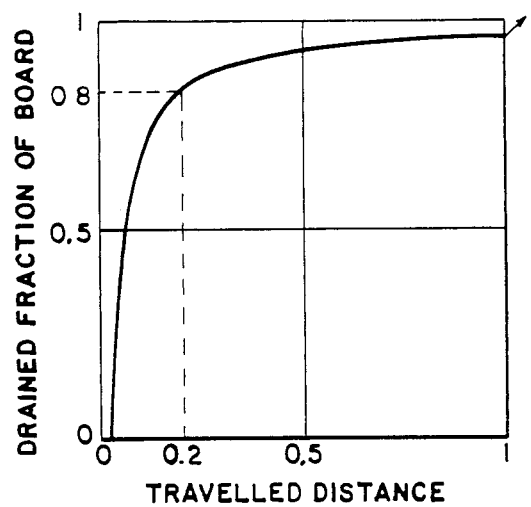
FIG. 3 shows a graph illustrating the portion of the PWB separated from the solder in the solder bath as a function of the horizontal displacement of the PWB on a typical drag soldering machine.
Figure 6:
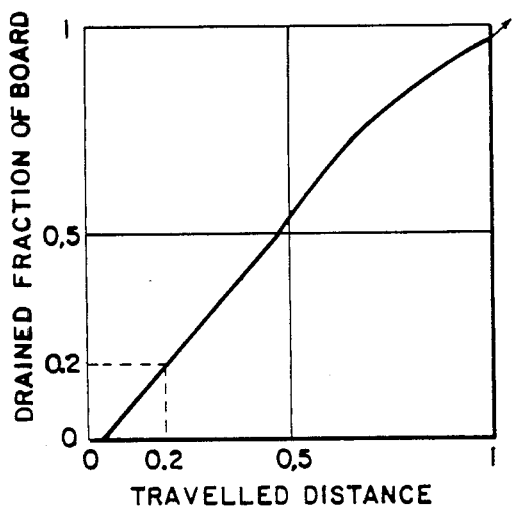
FIG. 6 shows the portion of the PWB separated from the solder in the solder bath as a function of the horizontal displacement of the PWB on a modified drag soldering machine utilizing the improvement of this invention.

In FIG. 4 the PWB 2 is moved across the drag guide 8 by a transport means 16 over the surface 10 of the solder bath 12 onto a curvilinear exit guide 15. Unlike FIG. 1, the curvilinear exit guide 15 provides a nonlinear contour of which the PWB 2 follows. Looking further at the exit guide details, FIG. 5 is similar to FIG. 2 except that it shows the travel of a PWB 2 over the curvilinear exit guide 15. FIG. 5 shows three positions 18, 20, 22 of the PWB having a leading edge 24, a middle point 26, and a trailing edge 2B. Unlike the linear exit guide found in FIG. 2, the curvilinear exit guide 15 in FIG. 5 provides for a much more uniform vertical velocity at the point of separation 30 of the PWBs from the solder bath. Furthermore, just as in FIG. 3, FIG. 6 approximately illustrates the results of using the curvilinear exit guide by showing the portion of the PWB separated from the solder bath as a function of the distance the PWB is advanced along the drag guide via the transport means. Note that unlike FIG. 3, the curve in FIG. 6 is much closer to a straight line. This indicates that as the PWB travels from the drag guide to the curvilinear exit guide the portion of the PWB that becomes separated from the solder bath increases in a relatively uniform manner. When the PWB has travelled about 20% of its length along the curvilinear exit guide, only approximately 20% of the PWB has separated from the solder in the solder baths. Similarly, this indicates the vertical velocity at the point of separation is relatively uniform and consequently relatively equal amounts of solder will be deposited across the length of the PWB.

Figure 7A:
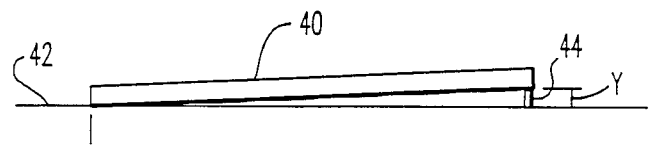
FIGS. 7(A) and 7(B) show two positions used to graphically generate an optimum curve for the exit guide.
Figure 7B:
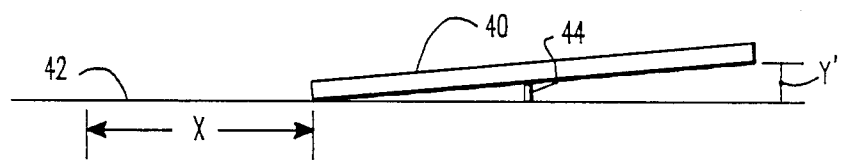

The contour of the curve ued as the exit guide is designed to provide for an approximately uniform vertical velocity at the point of separation across the length of the PWB. As an approximation for calculating the contour of a curve which would provide this constant vertical velocity, a curve was developed by which the separation distance, that is the vertical distance between the bottom of the PWB and the top of the solder bath at which the PWB separates from the solder, would occur at a fixed point along the drag solder machine guide. This may be graphically simulated by using a calibrated 8 inch ruler placed on its side with the far right end of the ruler resting on a vertical shim having a specific height. The length of the ruler may be any length corresponding to the length of the associated PWB. Note in actuality the PWB will rest in a pallet and the pallet will be transported along the guides but, for clarity, only the PWB will be discussed. While the ruler represents the PWB, the shim would represent the fixed and predetermined vertical separation distance. As an example, allow the shim height to be ⅛ inch which represents the vertical separation distance between the PWB and the solder bath at which separation initially occurs. The coordinates of the curve will be defined by the location of the right end of the ruler, with x identifying the distance of the ruler along the horizontal direction and y identifying the distance above the solder bath in the vertical direction. The right end of the ruler represents the leading edge of the PWB as it leaves the drag guide and begins ascending along the exit guide. FIG. 7A shows a ruler 40 with its left end resting on a flat surface 42 and its right end resting on a vertical shim 44. At this position the x coordinate is 0 and the y coordinate is the height of the right end of the ruler which is the height of the shim 44. To generate the curve the ruler 40, still on its side, is moved across the shim 44 a distance of 1 inch characterizing a 1 inch movement of the PWB along the exit guide. At this point x equals 1 inch and y would equal the vertical distance the right end of the ruler has moved from its original position. Proceeding to move the ruler at 1 inch increments to the right and recording the associated vertical distance the right end of the ruler has moved from its original position, a collection of data points may be acquired. FIG. 7B shows the ruler 40 moved a horizontal distance x along the flat surface 42 such that the right end of the ruler has moved upward and y' is now a distance from the flat surface 42. It can been seen that as the ruler 42 moves further and further to the right the y coordinate will continue to increase. Using an 8 inch ruler and a ⅛ inch vertical shim, Table 1 found below was constructed.

TABLE 1

| x | 0 | .5 | 1.0 | 2.0 | 3.0 | 4.0 | 5.0 | 6.0 | 7.0 | 7.5 |
|---|---|---|---|---|---|---|---|---|---|---|
| y | .12 | .13 | .14 | .17 | .20 | .25 | .33 | .50 | 1.00 | 1.94 |

Table 1 provides coordinates to generate a curve to be used as an exit guide that will permit the solder bath to separate from the bottom of the PWB at the same location along the exit guide throughout the travel of the PWB across the solder bath. Consequently, this provides for a vertical velocity across the length of the PWB that is approximately uniform.

The data for the curve found in Table 1 was derived exclusively for a PWB having a length of 8", although improved results over the linear exit guide would exist for other than PWBs having a length of 8". For an optimum curve the proportions of the curve in Table 1 are applicable to a PWB of any length. The x and y coordinates of Table 1 are for a PWB having a length of 8" but the curve coordinates may be increased or decreased by the ratio of the desired PWB length to that of the PWB length. In this manner an exit guide for a PWB having a length of 12" could be designed merely by multiplying the values of the coordinates in Table 1 by a factor of 12/8 or 1.5.

While this curve is one geometry that provides an approximately uniform vertical velocity for a PWB with a length of 8", any curve that provides an approximately uniform vertical velocity would be an improvement over the current linear exit guide. For this reason, while a series of points defining a line is provided, the invention should not be limited to such a configuration. Finally, note that in order to insure that all parts of the PWB reside in the solder bath for an equal amount of time, one embodiment of this invention would require that a curvilinear entry guide means 7, as seen in FIG.

4, be designed to follow the same contour as the curvilinear exit guide 15.

Figure 8:
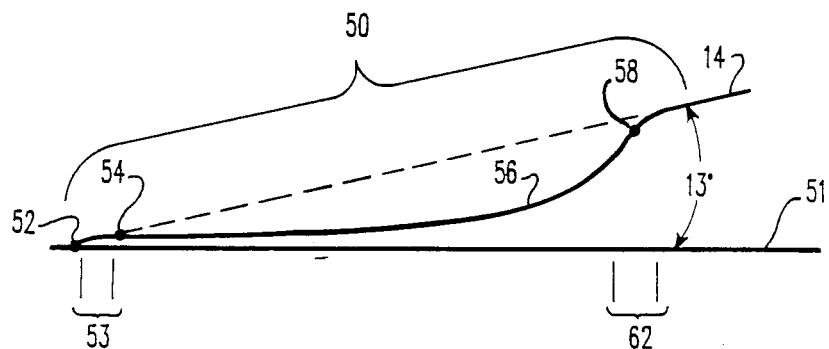
FIG. 8 shows a typical adaptation of a drag soldering machine incorporating the improved exit guide.

Existing drag soldering machines may be modified to incorporate the modified curvilinear exit guide. FIG. 8 shows a typical adaptation to a machine already using a linear exit guide 14 having an angle of approximately 13° measured from the horizontal. A section 50 (shown by dotted lines) of the existing linear exit guide which begins at the end of the drag guide 51 at point 52 must be removed and replaced with the modified exit guide. The modified exit guide must first direct the PWB (not shown) to a vertical distance sufficient to begin separation of the PWB from the solder in the solder bath. A vertical distance of ⅛" will be used but, as implied earlier this distance is a function of the solder and the solder temperature. The geometry of an initial segment 53 ending at point 54 used to raise the PWB ⅛" is not critical but should provide a smooth transition (i.e. raise the PWB ⅛" along a ½" initial segment 53 of the exit guide). Once the exit guide has raised the PWB to a vertical distance of ⅛", then beginning at point 54 the contour of an intermediate section 56 is defined by the curve in Table 1, or any proportional curve that provides an approximately uniform vertical velocity, should be followed to a point 58 just before the intersection of the modified curve with the path of the linear exit guide 14. A smooth transitional final segment 62 must be formed to link the curve defined in the intermediate section 56 with the remainder of the linear exit guide 14 still in place on the drag soldering machine. Note again that Table 1 data applies for a PWB having a length of 8" and that other proportional curves would be optimum for PWBs having different lengths.

As mentioned earlier, the linear entry guide of drag soldering machines may also be modified to incorporate a modified entry curve. This is shown by item 7 in FIG. 4. This would be done in the same manner in which the exit guide is modified. Using two similar curves for the entry guide and the exit guide insures the residency time in the solder bath of each part of the PWB will be equal.

Although this invention has been described with reference to a specific embodiment thereof, numerous modifications are possible without departing from the invention, and it is desirable to cover all modifications falling within the spirit and scope of this invention.

What is claimed is:

1. An improved drag soldering machine for printed wiring boards (PWB) having a molten solder bath; an entry guide for directing a PWB to a horizontal position partially submerged in the bath, the entry guide having a first and a second end; a drag guide for horizontally directing the PWB across the solder bath, the drag guide having a first and a second end with the drag guide first end connected to the entry guide second end; an exit guide for separating the PWB from the solder bath by directing the PWB up and away from the solder bath, the exit guide having a first and a second end with the drag guide second end connected to the exit guide first end; and a transport means for advancing the PWB in the guide wherein the improvement comprises;
a single exit guide following the contour of a nonlinear upwardly curved surface to provide an approximately uniform vertical velocity of the PWB at the point of separation of the PWB from the solder in the solder bath.

2. The apparatus in claim 1, wherein the exit guide contour for an 8" long PWB or pallet is defined by a curve beginning at the drag guide second end and comprised of:
(i) an initial segment having a first and a second end with the initial segment first end connected to the drag guide second end, the initial segment rising from the elevation of the drag guide to approximately ⅛";
(ii) an intermediate segment having a first end and a second end with the intermediate segment first end connected to the initial segment second end, the intermediate segment comprised of a curve defined by a horizontal distant, x in inches from the initial segment second end and a vertical distance y, in inches from the level of the drag guide wherein the intermediate segment is defined by the following coordinates:

| x | 0 | .5 | 1.0 | 2.0 | 3.0 | 4.0 | 5.0 | 6.0 | 7.0 | 7.5 |
|---|---|----|-----|-----|-----|-----|-----|-----|-----|-----|
| y | .12 | .13 | .14 | .17 | .20 | .25 | .33 | .50 | 1.00 | 1.94 |

(iii) a final segment having a first and a second end, the final segment first end connected to the initial segment second end and the final segment second end connecting to the existing linear exit guide to form a smooth transition.

3. The apparatus in claim 1, wherein the exit contour for a PWB or pallet of any length is defined by a curve beginning at the drag guide second end comprised of;
(i) an initial segment having a first and a second end with the initial segment first end connected to the drag guide second end, the initial segment rising from the elevation of the draft guide to approximately ⅛";
(ii) an intermediate segment having a first end and a second end with the intermediate segment first end connected to the initial segment second end, the intermediate segment comprised of a curve defined by a horizontal distance, x, in inches from the initial segment second end and a vertical distance, y, in inches from the level of the drag guide wherein the intermediate segment is directly proportional using the ratio of the length of the PWB compared with a PWB having an length and scaling by that ratio the curve defined by the following coordinates defined by the following points:

| x | 0 | .5 | 1.0 | 2.0 | 3.0 | 4.0 | 5.0 | 6.0 | 7.0 | 7.5 |
|---|---|----|-----|-----|-----|-----|-----|-----|-----|-----|
| y | .12 | .13 | .14 | .17 | .20 | .25 | .33 | .50 | 1.00 | 1.94 |

(iii) a final segment having a first and a second end, the final segment first end connected to the initial segment second end and the final segment second end connecting to the existing linear exit guide to form a smooth transition between the intermediate segment and the linear exit guide.

4. The apparatus in claim 2 wherein the entry guide has the same contour as the exit guide.

5. An improved method for soldering a PWB using a drag soldering machine having a molten solder bath, an entry guide for directing the PWB to a horizontal position partially submerged in the bath, a drag guide connected to the entry guide for horizontally directing the PWB across the solder bath, an exit guide connected to the drag guide for separating the PWB from the solder bath by directing the PWB up and away from the solder bath, and a transport means for advancing the PWB in the guides, wherein the improvement comprises:

removing the PWB from the solder bath along a nonlinear upwardly curved path such that the vertical velocity of the PWB at the point of separation of the PWB from the solder in the solder bath is approximately uniform across the length of the PWB.

6. The method in claim 5 further comprising introducing the PWB into the solder bath along a path having the same contour as that of the nonlinear upwardly curved path used for removing the PWB from the solder bath such that the vertical velocity of the PWB at the point of contact with the solder bath is approximately uniform across the length of the PWB.

* * * * *